United States Patent
Huang et al.

(10) Patent No.: US 11,521,901 B2
(45) Date of Patent: Dec. 6, 2022

(54) METHOD FOR PREPARING SEMICONDUCTOR DEVICE

(71) Applicant: NANYA TECHNOLOGY CORPORATION, New Taipei (TW)

(72) Inventors: Chun-Shun Huang, Taoyuan (TW); Jui-Hsiu Jao, Taoyuan (TW); Wei-Li Lai, Taichung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 123 days.

(21) Appl. No.: 17/202,948

(22) Filed: Mar. 16, 2021

(65) Prior Publication Data
US 2021/0210391 A1    Jul. 8, 2021

Related U.S. Application Data

(62) Division of application No. 16/459,017, filed on Jul. 1, 2019, now Pat. No. 10,985,077.

(60) Provisional application No. 62/769,823, filed on Nov. 20, 2018.

(51) Int. Cl.
*H01L 21/8238* (2006.01)
*H01L 21/66* (2006.01)

(52) U.S. Cl.
CPC ........ *H01L 21/823878* (2013.01); *H01L 21/823892* (2013.01); *H01L 22/14* (2013.01); *H01L 22/34* (2013.01)

(58) Field of Classification Search
CPC ........... H01L 21/823878; H01L 21/823892
USPC ............................................. 257/48
See application file for complete search history.

(56) References Cited

U.S. PATENT DOCUMENTS

| | | | |
|---|---|---|---|
| 7,960,998 | B2 | 6/2011 | Rozario et al. |
| 2004/0017710 | A1 | 1/2004 | Chang et al. |
| 2004/0061112 | A1 | 4/2004 | Felber et al. |
| 2004/0069989 | A1 | 4/2004 | Wu et al. |

(Continued)

FOREIGN PATENT DOCUMENTS

| | | |
|---|---|---|
| CN | 102420128 A | 4/2012 |
| CN | 103346100 A | 10/2013 |

(Continued)

OTHER PUBLICATIONS

Office Action dated Dec. 27, 2019 related to TW Application No. 108125570.
English machine translation of TW 1226093B (Year:2004).

*Primary Examiner* — Dzung Tran
(74) *Attorney, Agent, or Firm* — Muncy, Geissler, Olds & Lowe, P.C.

(57) ABSTRACT

The present disclosure provides a method for preparing a semiconductor device. The semiconductor device includes a substrate, a first region, a second region, a third region, a fourth region, a fifth region and a sixth region. The first type region is disposed on the substrate and has a ring structure. The second type region is disposed on the substrate and disposed in the center of the first type region. A plurality of second well regions are formed in the first region, the second region, the fourth region, the fifth region and the sixth region. A plurality of second well regions in the first region, the second region, the fourth region, the fifth region and the sixth region. The first well region, the second well region, the first type region and the second type region are formed by ion implantation.

4 Claims, 19 Drawing Sheets

(56) References Cited

U.S. PATENT DOCUMENTS

| | | |
|---|---|---|
| 2004/0076056 A1 | 4/2004 | Chang et al. |
| 2005/0042779 A1 | 2/2005 | Han |
| 2005/0199931 A1 | 9/2005 | Lin |
| 2011/0304350 A1* | 12/2011 | Christensen ............ H01L 22/34 |
| | | 324/762.09 |

FOREIGN PATENT DOCUMENTS

| | | | |
|---|---|---|---|
| CN | 104078337 | A | 10/2014 |
| JP | 2014060361 | A | 4/2014 |
| TW | 200428553 | A | 12/2004 |
| TW | 200428553 | A | 12/2004 |

\* cited by examiner

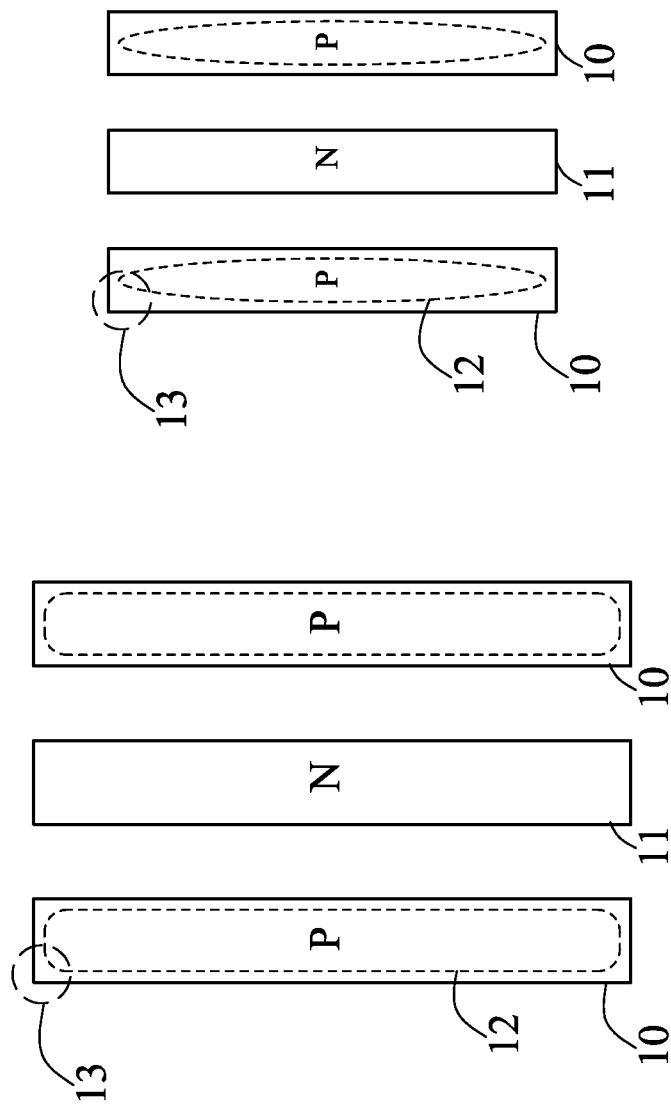

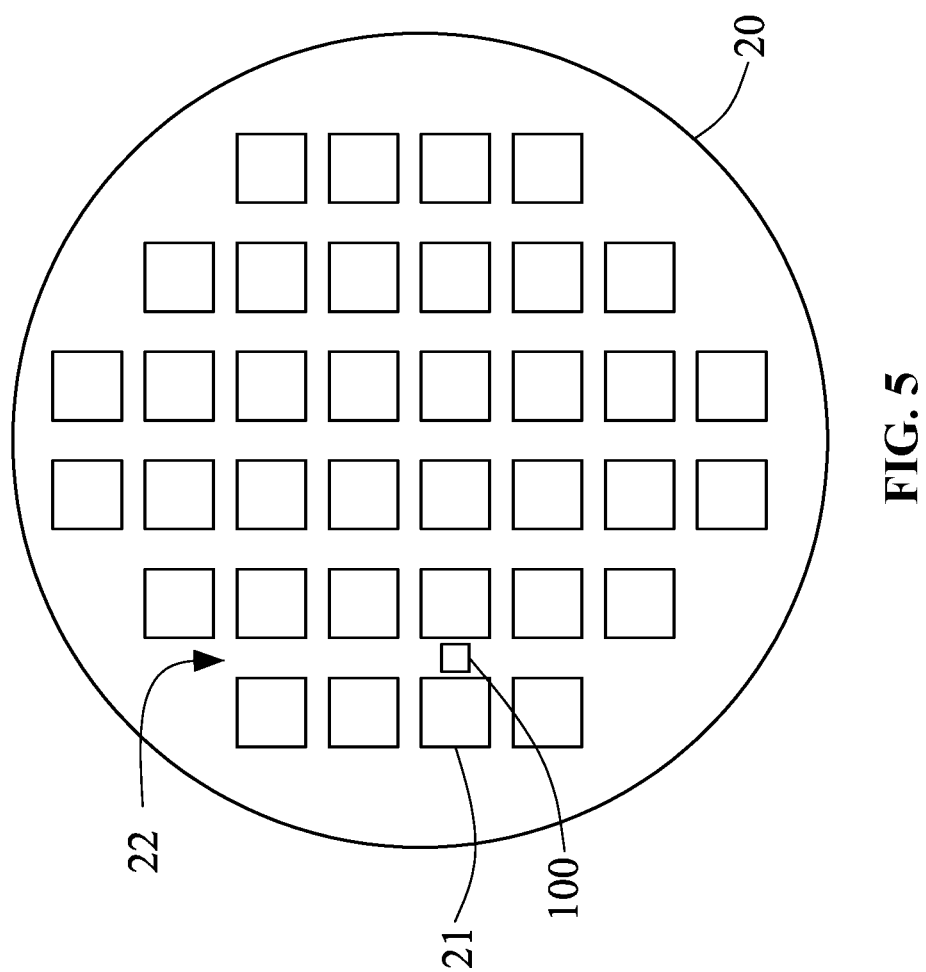

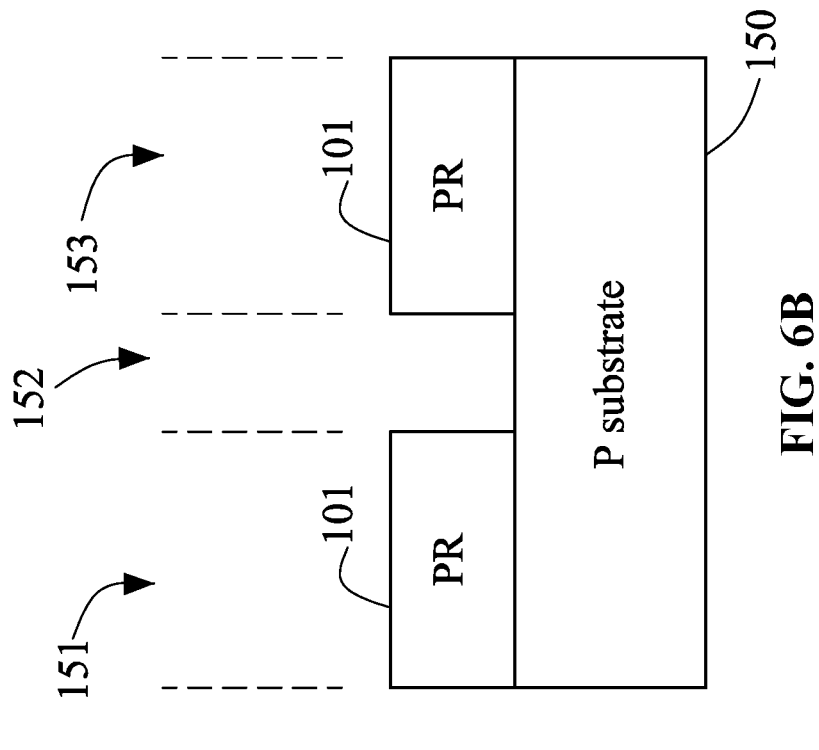
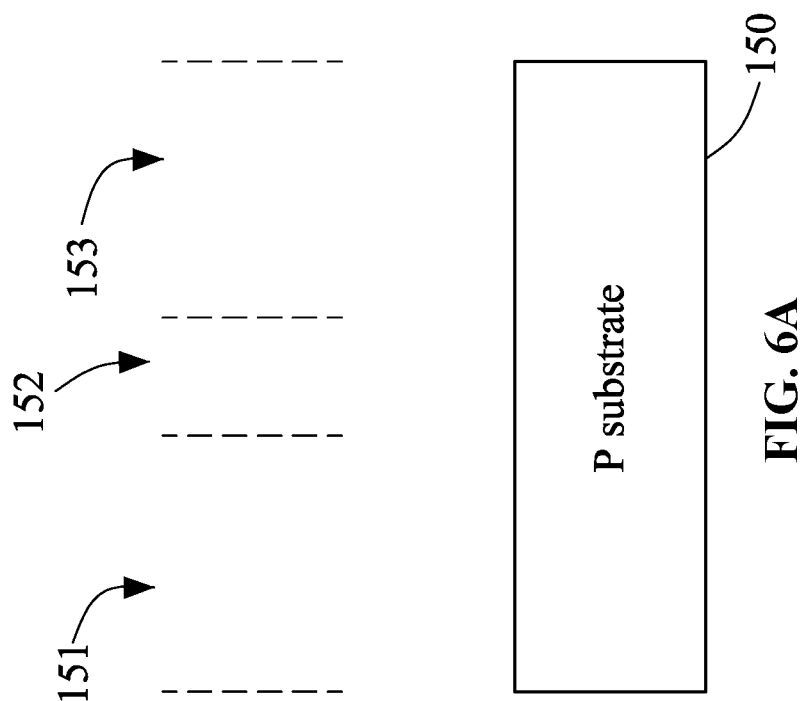
FIG. 6B
FIG. 6A

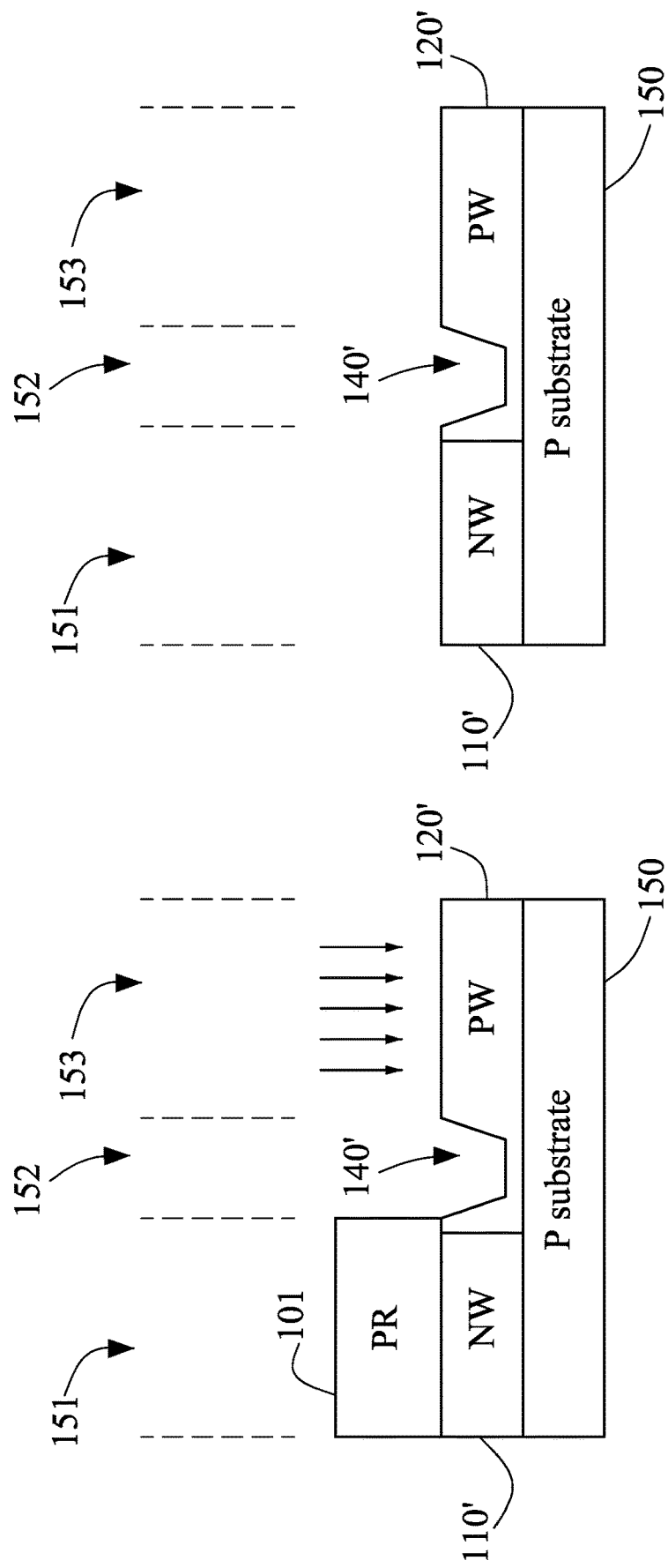

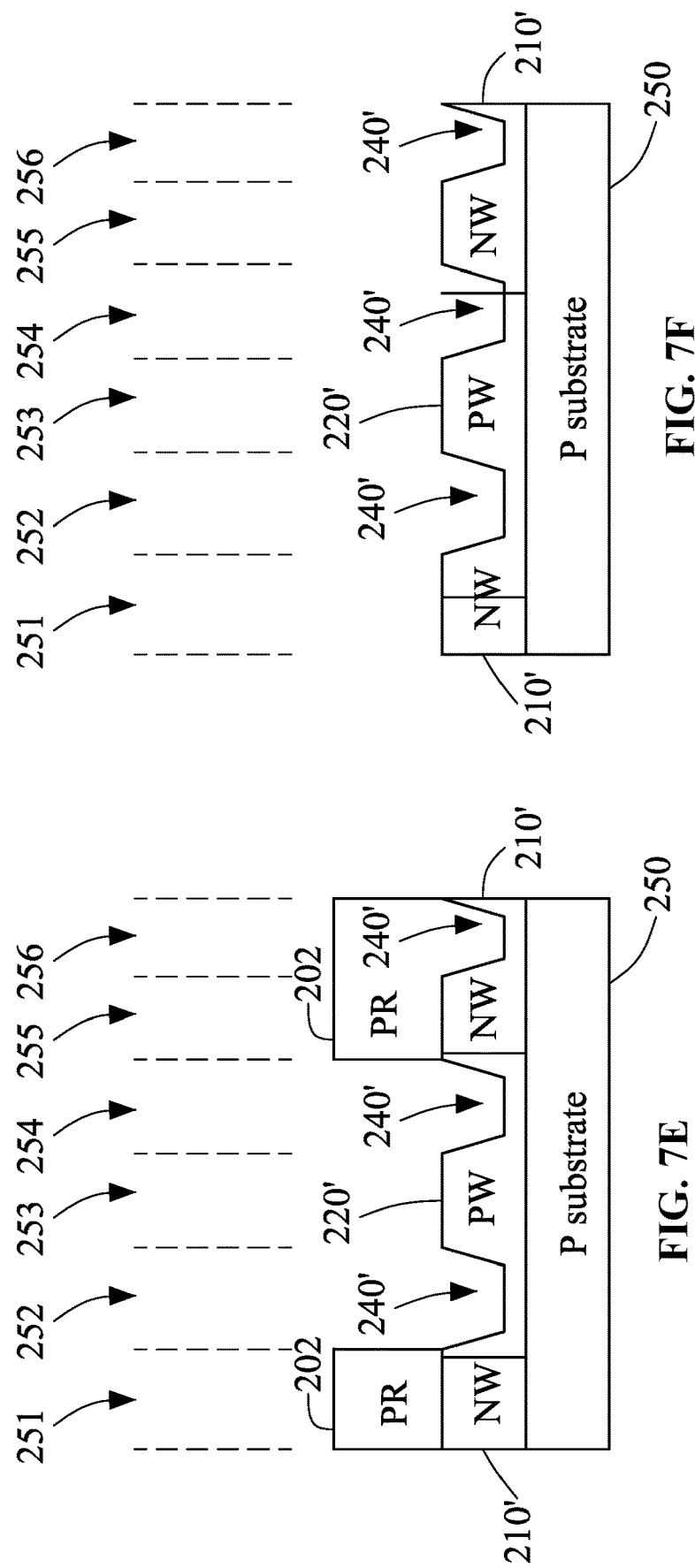

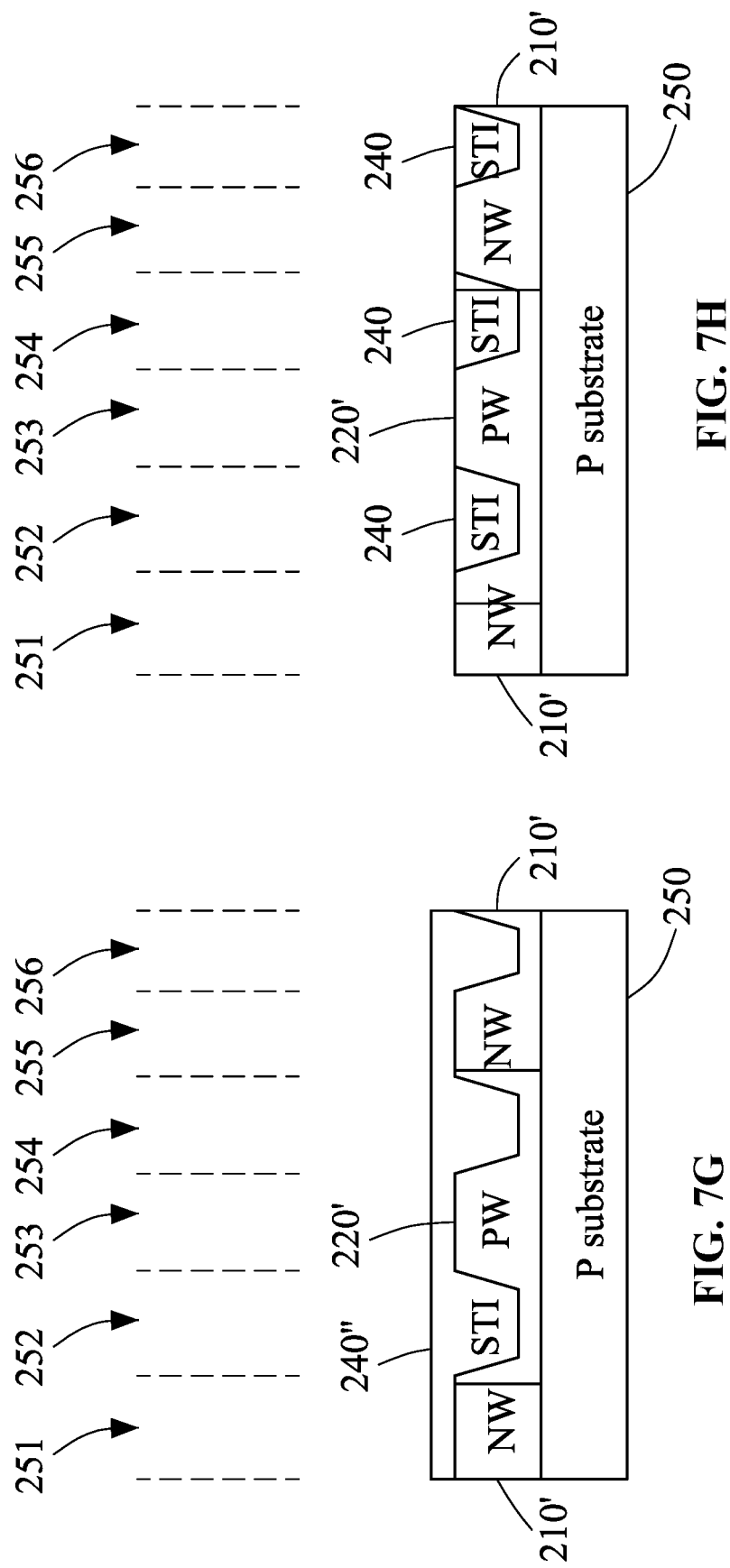

METHOD FOR PREPARING SEMICONDUCTOR DEVICE

CROSS-REFERENCE TO RELATED APPLICATION

This application is a divisional application of U.S. Non-Provisional application Ser. No. 16/459,017 and claims the benefit of U.S. Provisional Patent Application No. 62/769,823 filed Nov. 20, 2018, which is incorporated herein by reference in its entirety.

TECHNICAL FIELD

The present disclosure relates to a method for preparing a semiconductor device, and more particularly to a method for preparing a semiconductor device for testing leakage current.

DISCUSSION OF THE BACKGROUND

Ion implantation is one way of doping semiconductors. The ions to be added are first ionized to enhance the energy or kinetic energy of the impurities. Next, an electric field is used to accelerate the velocity of the ions and a magnetic field changes the direction of motion. Impurities are driven directly into the germanium wafer, allowing impurity atoms to diffuse into the wafer. An ideal implant region is sought in order to implant ions into as much of the wafer as possible. However, due to the loading effect, corners of the implant region cannot be implanted with ions.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device including a substrate, a first type region, a second type region and an isolation structure. The first type region is disposed on the substrate and has a ring structure. The second type region is disposed on the substrate and disposed in the center of the first type region. The isolation structure is disposed between the first type region and the second type region, wherein the second type region has a square shape and includes a plurality of corners.

In some embodiments, the plurality of corners further comprises a plurality of sub-block structures.

In some embodiments, the first type region is a P-type structure, and the second type region is an N-type structure.

In some embodiments, the semiconductor device is disposed on a scribe line of a wafer.

Another aspect of the present disclosure provides a semiconductor device comprising: a substrate, a first type region, a second type region and an isolation structure. The first type region is disposed on the substrate and has a line structure, and the first type region further includes a plurality of turns and a plurality of U-shaped structures. The second type region is disposed on the substrate, and comprises a plurality of vertical structures and a plurality of horizontal structures, the horizontal structures extending into the U-shaped structure. The isolation structure is disposed between the first tape region and the second type region, wherein the second type region has a square shape and includes a plurality of corners.

In some embodiments, the plurality of corners comprise a plurality of sub-block structures.

In some embodiments, the first type region is a P-type structure, and the second type region is an N-type structure.

In some embodiments, the semiconductor device is disposed on a scribe line of a wafer.

Another aspect of the present disclosure provides a method for preparing semiconductor devices, the method comprising: providing a substrate, wherein the substrate comprises a first region, a second region and a third region, wherein the second region is disposed between the first region and the third region; forming a plurality of photoresists in the first region and the third region; forming a groove in the third region; removing the photoresist of the first region; forming a second well region in the first region; forming a photoresist in the first region, removing the photoresist of the third region, and forming a first well region in the second region and the third region; removing the photoresist of the first region; forming an isolation structure in the groove; forming a plurality of photoresists in the second region and the third region, and forming a second type region in the first region; removing the photoresist of the third region, forming a photoresist in the first region, and forming a first type region in the third region; and removing the photoresists of the first region and the second region, wherein the first well region, the second well region, the first type region and the second type region are formed by ion implantation.

In some embodiments, the method further comprises: forming an isolation structure layer on a surface of the substrate, the isolation structure layer covering the surface of the substrate; and removing the isolation structure layer along the surface of the substrate.

In some embodiments, the substrate is a P-type substrate.

In some embodiments, the first type region is a P-type structure, the second type region is an N-type structure, the first well region is a P-type well and the second well region is an N-type well.

Another aspect of the present disclosure provides a method for preparing a semiconductor device, the method comprising: providing a substrate, wherein the substrate includes a first region, a second region, a third region, a fourth region, a fifth region and a sixth region, the second region is disposed between the first region and the third region, the fourth region is disposed between the third region and the fifth region, and the fifth region is disposed between the fourth region and the sixth region; forming a plurality of photoresists in the first region, the third region and the fifth region; forming a plurality of grooves in the second region, the fourth region and the sixth region; removing the photoresists of the first region and the fifth region and forming a plurality of second well regions in the first region, the second region, the fourth region, the fifth region and the sixth region; removing the photoresist of the third region, forming a photoresist in the first region, the fifth region and the sixth region, and forming a first well region in the second region, the third region and the fourth region; removing the photoresists of the first region, the fifth region and the sixth region; forming a plurality of isolation structures in the grooves of the second region, the fourth region, and the sixth region; forming a photoresist in the second region, the third region, and the fourth region, and forming a plurality of second type regions in the first region and the fifth region; removing the photoresist of the third region, forming a photoresist in the first region and the fifth region, and forming a plurality of first type regions in the third region; and removing the photoresists of the first region, the second region, the fourth region and the fifth region; wherein the first well region, the second well region, the first type region and the second type region are formed by ion implantation.

In some embodiments, the method further comprises: forming an isolation structure layer on a surface of the substrate, so that the isolation structure layer covers the surface of the substrate; and removing the isolation structure layer from the surface of the substrate.

In some embodiments, the substrate is a P-type substrate.

In some embodiments, the first type region is a P-type structure, the second type region is an N-type structure, the first well region is a P-type well, and the second well region is an N-type well.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

FIG. 1A and FIG. 1B are schematic diagrams showing a comparative semiconductor device having a conventional PN junction.

FIG. 5 is a schematic view showing the arrangement of a semiconductor device in accordance with some embodiments of the present disclosure.

FIG. 6A through FIG. 6K illustrate a method of preparing the semiconductor device shown in FIG. 3E in accordance with some embodiments of the present disclosure.

FIG. 7A through FIG. 7K illustrate a method of preparing the semiconductor device shown in FIG. 4A in accordance with some embodiments of the present disclosure.

DETAILED DESCRIPTION

Figure 2B:
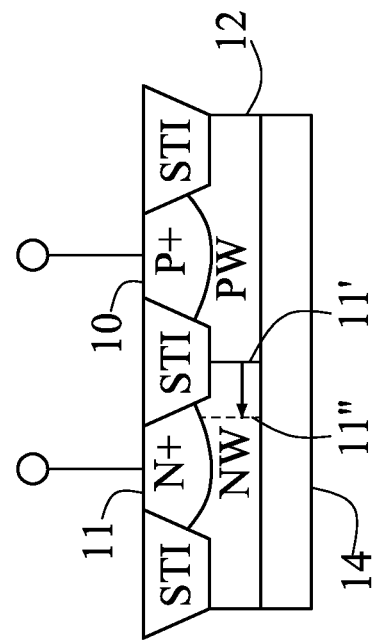
FIG. 2A and FIG. 2B are schematic diagrams showing a structure for testing leakage current.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates, Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A and FIG. 1B are schematic diagrams showing a comparative semiconductor device having a conventional PN junction.

Referring to FIG. 1A and FIG. 1B, the conventional PN junction implants ions into the P-region 10 to form a P-type well 12 (PW).

As shown in FIG. 1A, an ideal implant region is sought in order to implant ions into as much of the P-region 10 as possible. However, due to the loading effect, the corners 13 of the P-region 10 cannot be completely implanted with ions, such that the formed P-type well 12 is slightly smaller than the original P-region 10, particularly at the corners 13. As can be seen in FIG. 1B, the influence of the loading effect is more pronounced in the formation of the P-type well 12 and the P-region 10 of a smaller device.

Figure 2A:
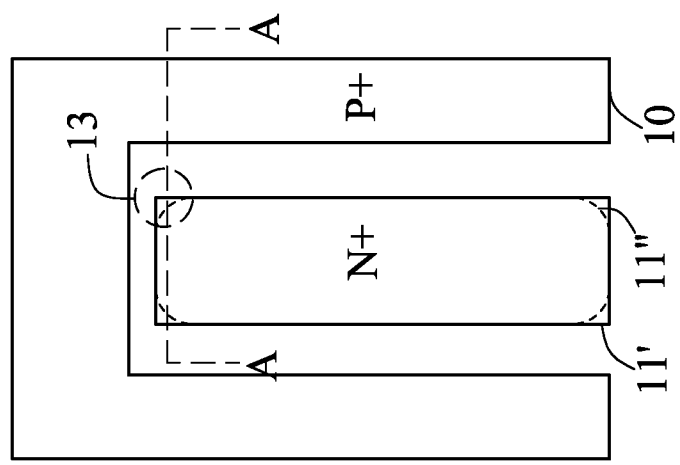

FIG. 2A and FIG. 2B are schematic diagrams showing a structure for testing leakage current. Referring to FIG. 2A and FIG. 2B, the N-type structure 11 is implanted, and the N-type well 11" (NW) cannot completely cover the entire N-region 11' due to the loading effect, particularly near the corner 13. FIG. 2B is a cross-sectional view along line AA in FIG. 2A. Due to the influence of the loading effect, the formed N-type well 11" is smaller than the N-region 11', resulting in contact between the P-type well 12 and the N-type structure 11, which in turn generates leakage current. This phenomenon can be used as a basis for checking leakage current of the overall device. However, with the conventional design, the contact area between the P-type well 12 and the N-type structure 11 is small, resulting in the leakage current being too small for easy detection.

Therefore, there is a need for an improved method of detecting leakage current.

Figure 3B:
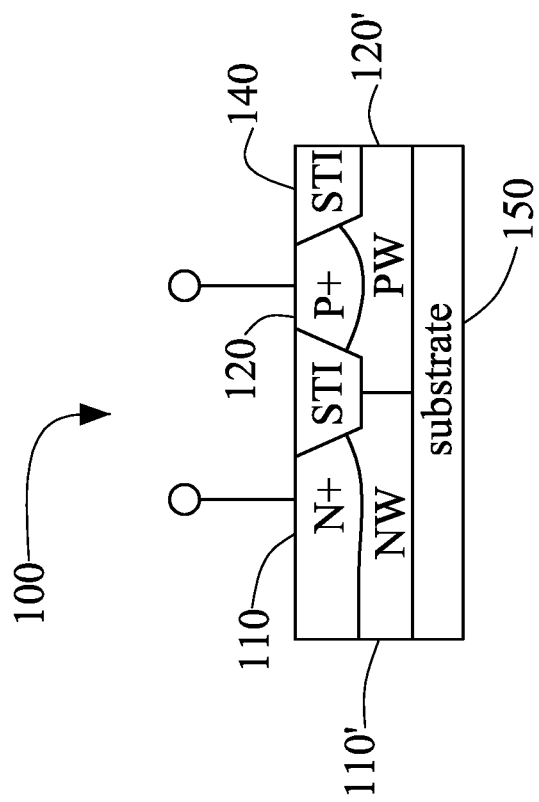
FIG. 3A and FIG. 3B are schematic diagrams showing a semiconductor device implanted under ideal conditions.
Figure 3A:
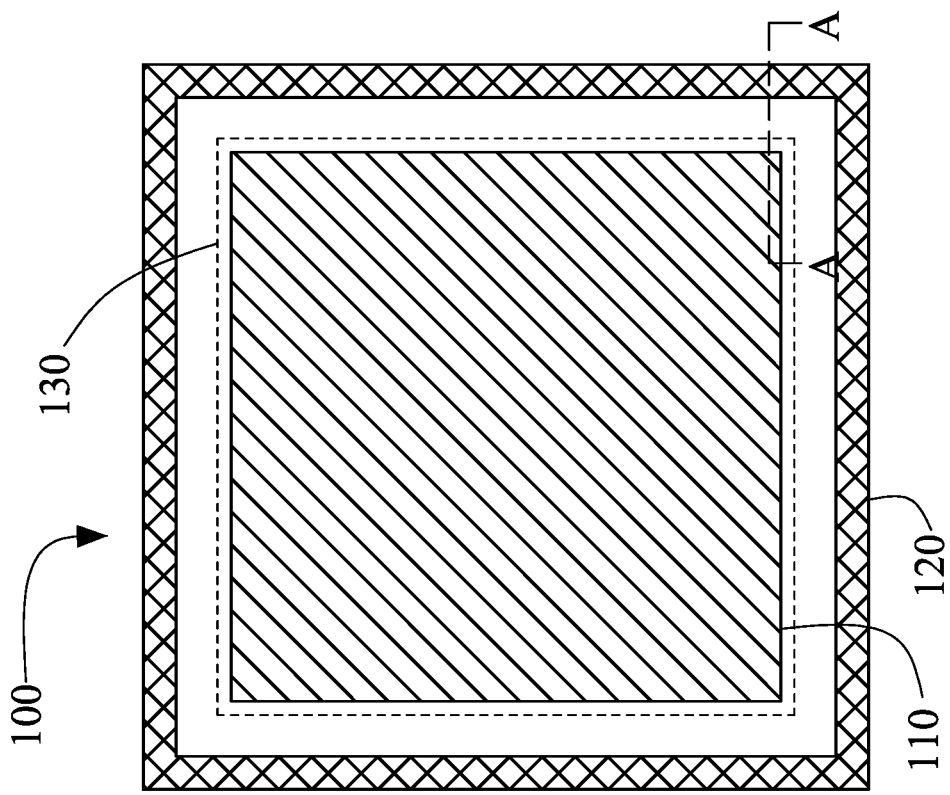

FIG. 3A and FIG. 3B are schematic diagrams of a semiconductor device implanted under ideal conditions. The semiconductor device 100 includes a substrate 150, a first type region 120 and a second type region 110. In some embodiments, the first type region 120 and the second type region 110 are a P-type structure and an N-type structure, respectively. However, the disclosure is not limited thereto, and those skilled in the art should know that the first type region 120 can also be an N-type structure, and the second type region can also be a P-type structure, according to design requirements. For convenience of description, the following embodiments are unified in that the first type region 120 is a P-type structure, and the second type region 110 is an N-type structure.

In some embodiments, the P-type structure 120 and the N-type structure 110 are disposed on the substrate 150, wherein the P-type structure 120 is a ring-shaped structure, and the N-type structure 110 is disposed at the center of the P-type structure 120. That is, the P-type structure 120 surrounds the N-type structure 110, and the N-type structure 110 assumes a square structure and includes a plurality of corners. There is also an isolation structure 140 between the P-type structure 120 and the N-type structure 110. The isolation structure 140 refers to a shallow trench isolation (STI).

The semiconductor device 100 includes an implanted region 130 that is slightly larger than the N-type structure 110 and is intended to define a second well region 110'. After the ion implantation, a portion of the semiconductor device 100 is as shown in FIG. 3B, which is a cross-sectional view taken along line A-A of FIG. 3A. The P-type structure 120 and the N-type structure 110 facilitate the formation of the second well region 110' and the first well region 120'. The different is states of the semiconductor device 100 shown in FIGS. 3A and 3B indicate the result of an ion implantation performed under ideal conditions.

In some embodiments, the second well region 110' and the first well region 120' are an N-type well and a P-type well, respectively. However, the disclosure is not limited thereto, and those skilled in the art should know that the first well region 120' may also be an N-type well, and the second well region 110' may also be a P-type well, according to design requirements. For convenience of explanation, the following embodiments are unified in that the well region 120' is a P-type well and the second well region 110' is an N-type well.

Figure 3D:
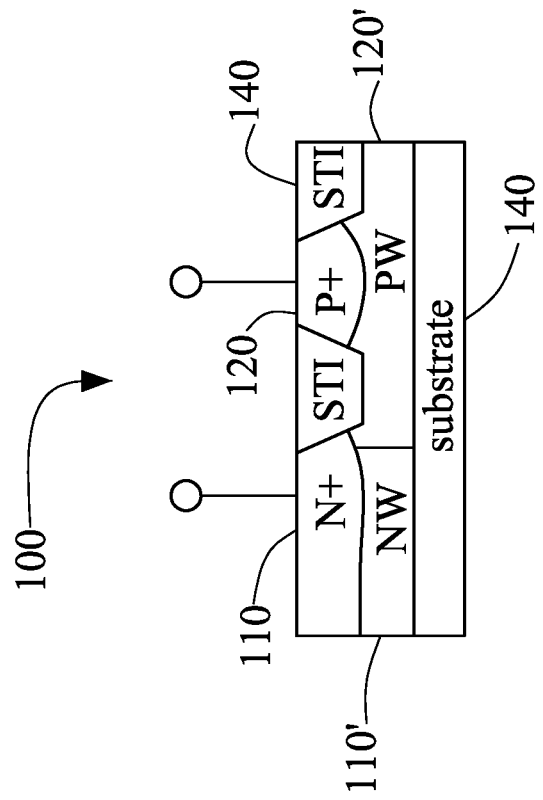
FIG. 3C and FIG. 3D are schematic diagrams showing a semiconductor device implanted under actual conditions.
Figure 3C:
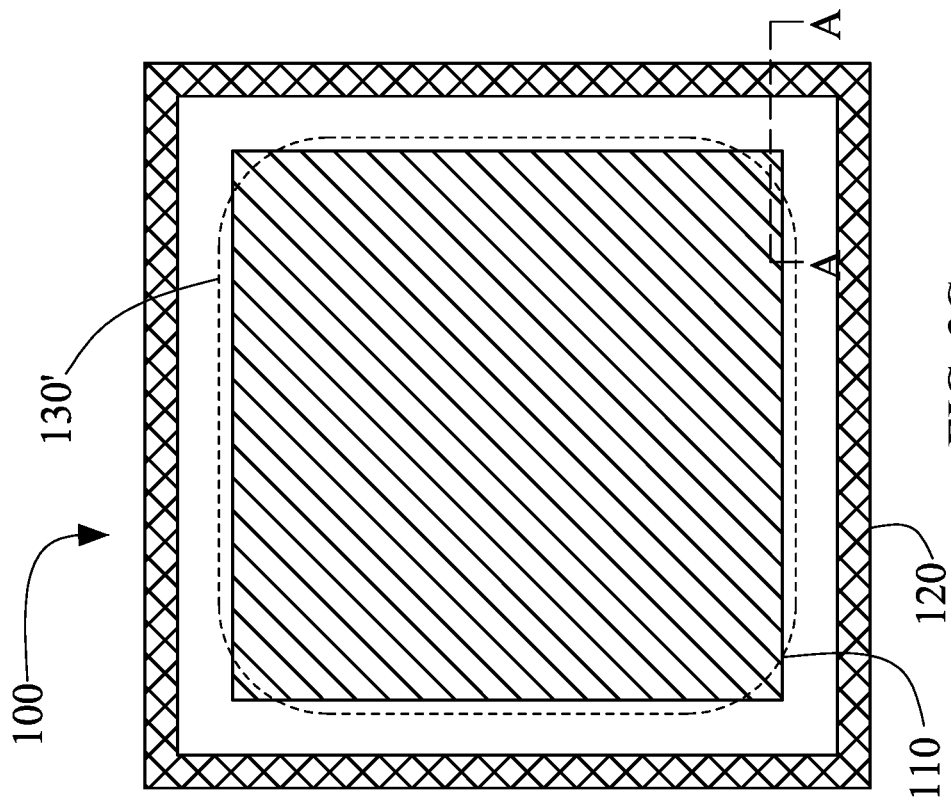

FIG. 3C and FIG. 3D are schematic diagrams of a semiconductor device 100 implanted under actual conditions. As shown in FIG. 3C, the actual implanted region 130' is rounded at the corners of the N-type structure 110 due to the loading effect. Therefore, as shown in the cross-sectional view of FIG. 3D, the area of the N-type well region 110' below the N-type structure 110 is smaller, and the area of the P-type well region 120' is greater, and the P-type well region 120' is in contact with the N-type structure 110. As a result, the leakage current is more easily detected.

Figure 3E:
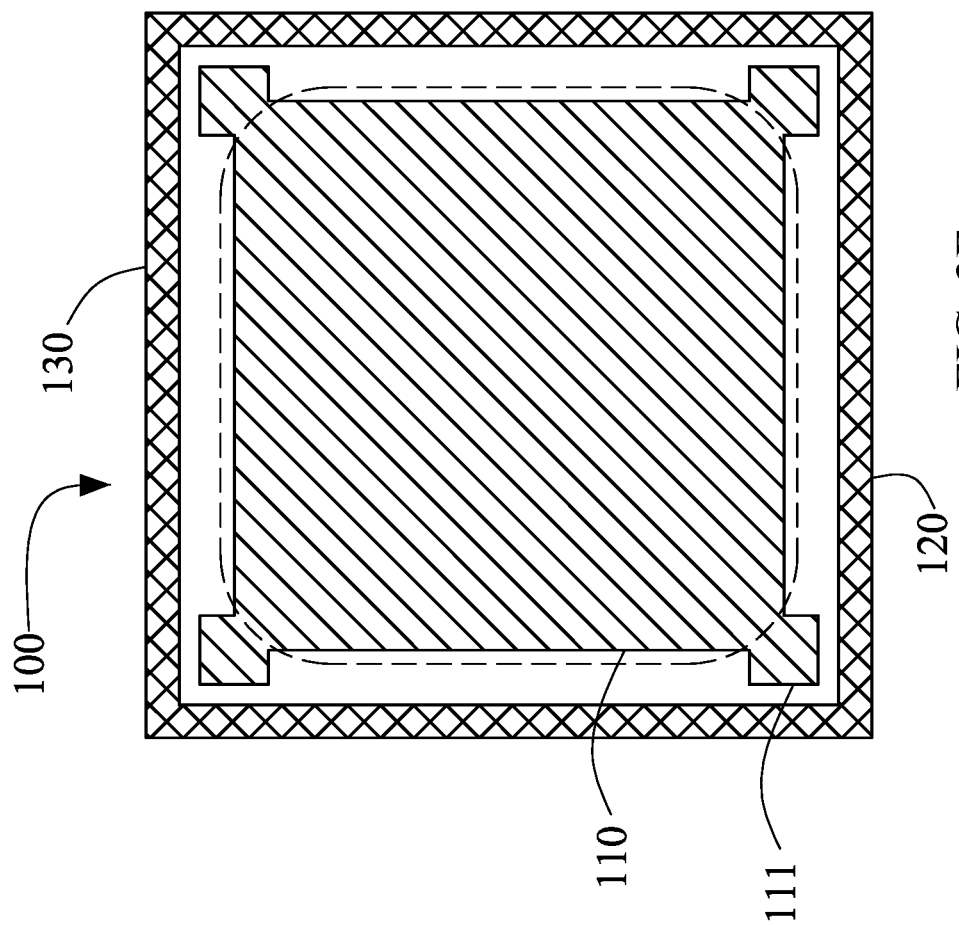
FIG. 3E is a schematic diagram illustrating a semiconductor device in accordance with some embodiments of the present disclosure.

The loading effect is most likely to influence the ion implantation at the corners of the implanted device. This effect is illustrated in FIG. 3E, which shows the semiconductor device 100 in accordance with some embodiments of the present disclosure. In one embodiment, the corners of the N-type structure 110 are provided with a plurality of sub-corner structures 111. The arrangement of the sub-corner structure 111 causes the N-type structure to include more corners, and the contact area between the P-type well region 120' and the N-type structure 110 is enlarged, thereby causing the leakage current phenomenon to be more readily detected.

Figure 4A:
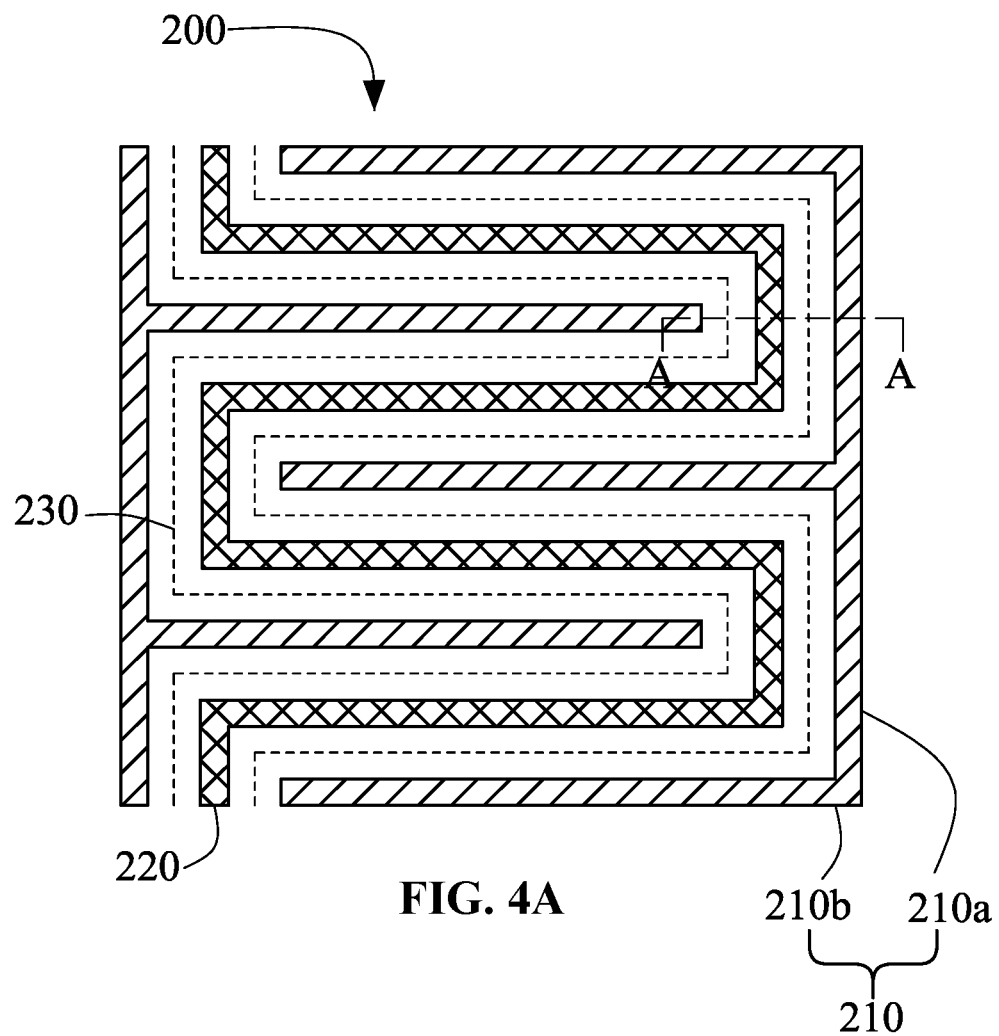
FIG. 4A and FIG. 4B are schematic diagrams illustrating another semiconductor device in accordance with some embodiments of the present disclosure.
Figure 4B:
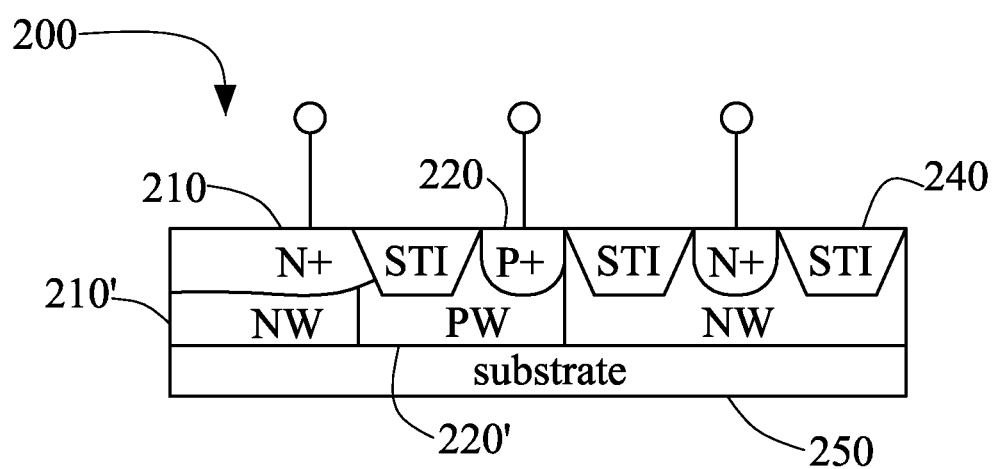

FIG. 4A and FIG. 4B illustrate another semiconductor device 200 in accordance with some embodiments of the present disclosure. In some embodiments, the semiconductor device 200 includes a substrate 250, a P-type structure 220, and an N-type structure 210. The main difference between this embodiment and the embodiment described with respect to FIGS. 3C to 3E is that the shapes of the P-type structure 220 and the N-type structure 210 are changed. In the present embodiment, the P-type structure 220 is disposed on the substrate 250, and the P-type structure 220 assumes a linear structure while including a plurality of transition points to the U-shaped structure; that is, the P-type structure 220 presents a winding linear structure that changes direction multiple times.

The N-type structure 210 is disposed on the substrate 250, and the N-type structure 210 includes a plurality of vertical structures 210a and horizontal structures 210b. The plurality of vertical structures 210a and the plurality of horizontal structures 210b are connected to each other such that the N-type structure 210 exhibits a plurality of T-shaped structures connected to each other. The horizontal structure 210b is a U-shaped structure that protrudes into the P-type structure 220. An isolation structure 240 is disposed between the P-type structure 220 and the N-type structure 210. In the current embodiment, the phenomenon of the loading effect occurs mostly in the portions where the structure exhibits a bend or turn; therefore, as shown in FIG. 4A, the P-type structure 220 and the N-type structure 210 disposed at the periphery are formed with additional bends added to increase the turning portion, thereby further increasing the area where loading effects are more likely to occur.

FIG. 4B is a cross-sectional view of the semiconductor device 200 after ion implantation of the implanted region 230. After implantation, the N-type structure 210 and the P-type structure 220 form an N-type well region 210' and a P-type well region 220', respectively. Due to the incomplete implantation, the area of the P-type well region 220' is enlarged, and the P-type well region 220' is brought into contact with the N-type structure 210. When the P-type well region 220' is in contact with the N-type structure 210, leakage current is generated, thereby improving the sensitivity of leakage detection.

FIG. 5 is a schematic diagram of an arrangement of semiconductor devices in accordance with one embodiment of the present disclosure. In this embodiment, a variety of microstructure devices 21 are disposed on the wafer 20, and the semiconductor device 100 of the present disclosure is disposed on a scribe line 22 of the base wafer 20, The semiconductor device 100 is disposed on the scribe line 22 between the microstructure devices 21.

The semiconductor device 100 is used for testing purposes to measure the leakage current condition of other microstructure devices 21 on the wafer 20. After the test is completed, the semiconductor device 100 is removed when the wafer 20 is cut, so the semiconductor device 100 does not affect the other microstructure devices 21 on the wafer 20. That is, the main purpose of the semiconductor device 100 is to detect the leakage current phenomenon of the entire wafer 20. Moreover, since the scribe line 22 is designed as a portion to be cut off, and the wafer testing device 100 is disposed on the scribe line 22, there is no need to set the semiconductor device 100 at other locations of the wafer 20, thereby saving material usage of the wafer, and the semiconductor device 100 does not occupy the space of other microstructure devices 21.

FIG. 6A to FIG. 6K illustrate a method of preparing the semiconductor device 100 shown in FIG. 3E in accordance with some embodiments of the present disclosure. First, referring to FIG. 6A, in some embodiments, a substrate 150 is provided. The substrate 150 includes a first region 151, a second region 152 and a third region 153. In some embodiments, the second region 152 is disposed between the first region 151 and the third region 153. In the present embodiment, the substrate 150 is a P-type substrate.

Next, referring to FIG. 6B, in some embodiments, a plurality of photoresists 101 are formed in the first region 151 and the third region 153, wherein the photoresists (PR) protect the PR-covered regions, so that the PR-covered regions are not affected by subsequent etching or ion implantation.

Figure 6D:
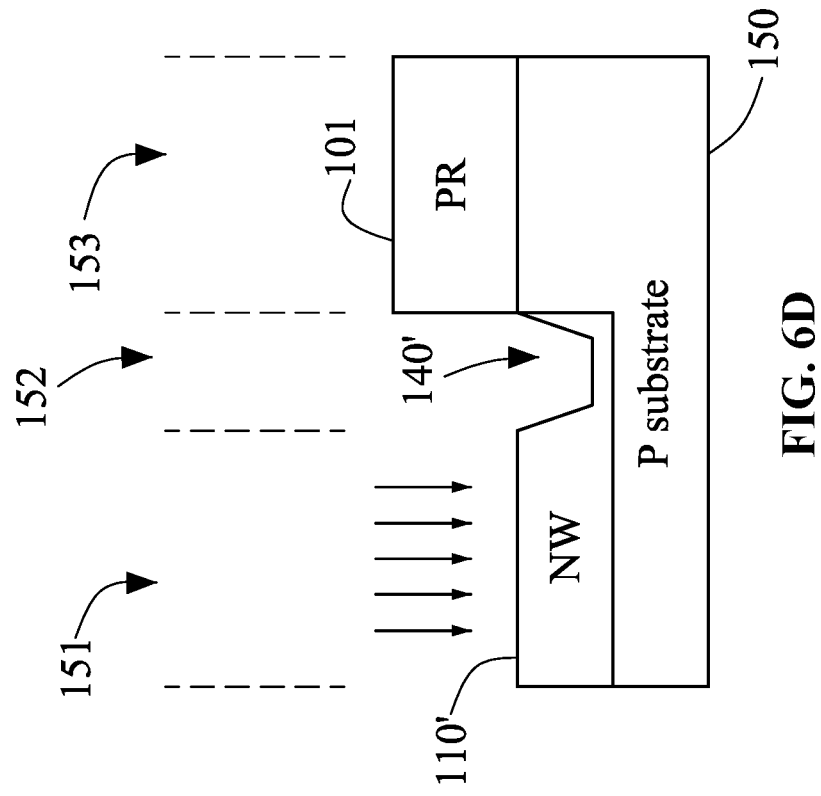
Figure 6C:
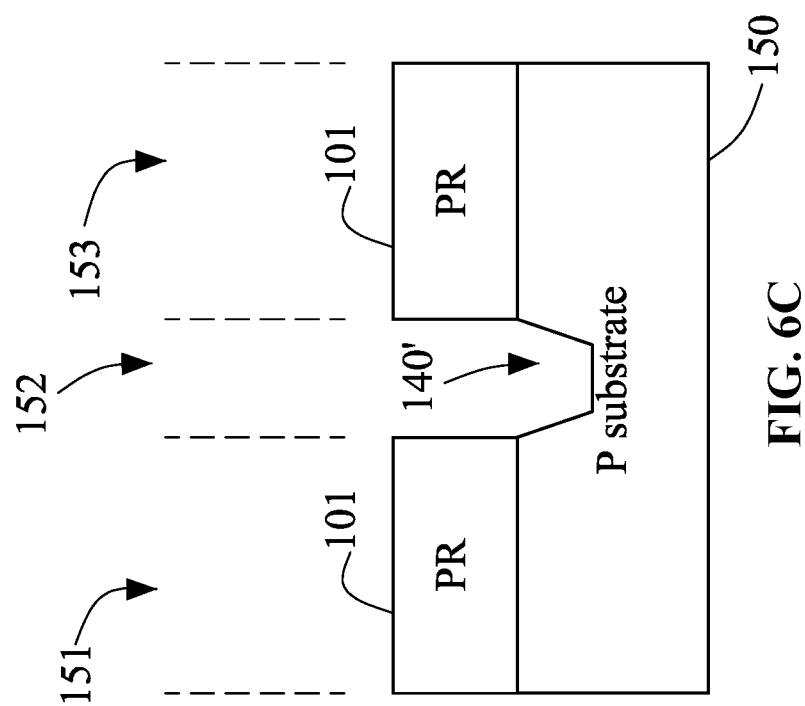
Figure 6H:
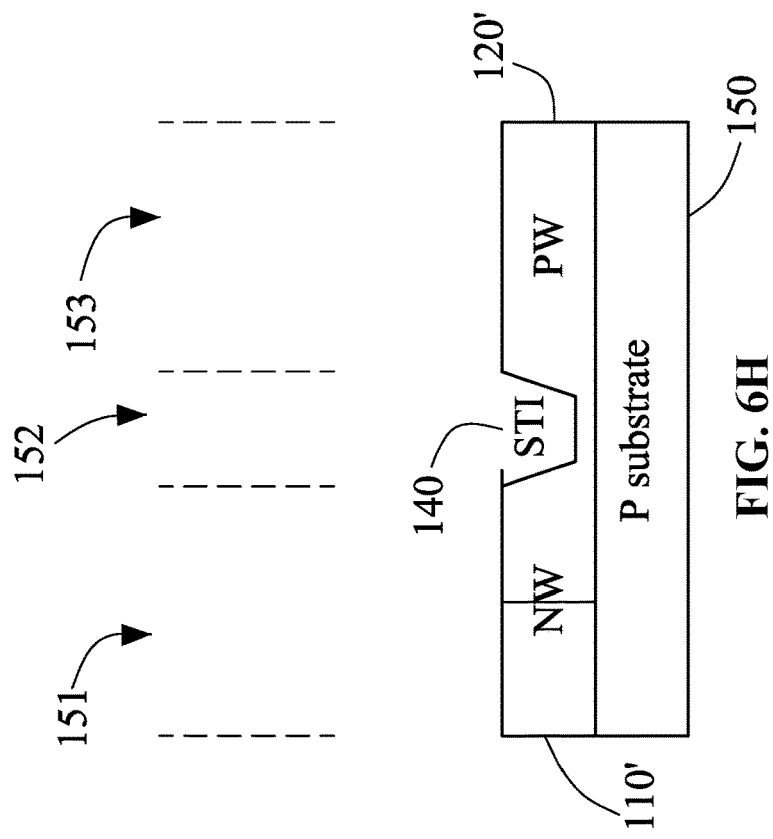
Figure 6G:
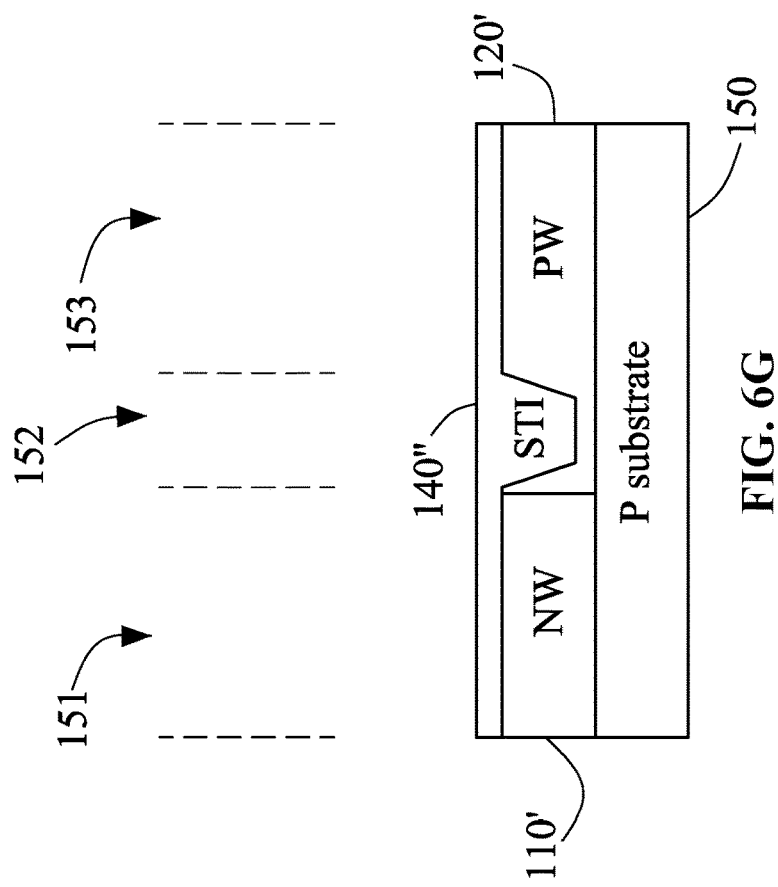
Figure 6J:
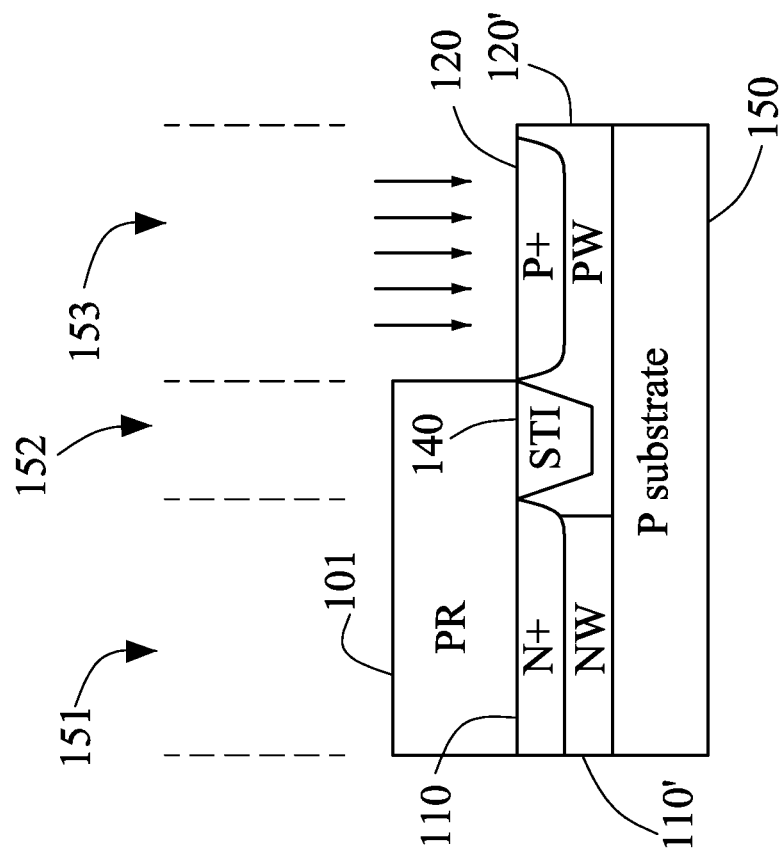

Next, referring to FIG. 6C, a groove 140' is formed on the substrate 150, within the second region 152. In the present embodiment, the groove 140' is formed by an etch-through technique, while the first region 151 and the third region 153 are covered with the photoresist 101, so the first region 151 and the third region 153 of the substrate 150 are not affected by the etch-through technique.

Referring to FIG. 6D, after the groove 140' is formed, the photoresist 101 in the first region 151 is removed, and an N-type well region 110' is formed on the substrate 150, within the first region 151. Next, referring to FIG. 6E, in some embodiments, a photoresist 101 is formed in the first region 151, that is, over the N-type well region 110', while the photoresist 101 of the third region 153 is removed, and a P-type well region 120' is formed in the second region 152 and the third region 153. Significantly, when the P-type well region 120' is formed, the area of the N-type well region 110' is reduced due to the loading effect, so that a portion of the first region 151 is included in the P-type well region 120'.

The above-described steps use ion implantation techniques to form an N-type well region 110' and a P-type well region 120'. Therefore, when the substrate 150 is subjected to ion implantation, the substrate 150 is converted into the N-type well region 110' or the P-type well region 120' due to the difference in amount of implanted ions. Portions covered by the photoresist 101 are not affected by the implantation.

Referring to FIG. 6F, the photoresists 101 of the first region 151 are removed. Next, referring to FIG. 6G, an isolation structure layer 140" is formed on the surface of the substrate 150, and the isolation structure layer 140" fills the groove 140' and covers the surface of the substrate 150. Thereafter, referring to FIG. 6H, the isolation structure layer 140" is removed from the surface of the substrate 150, and an isolation structure 140 is further formed in the groove 140'. In this embodiment, the isolation structure layer 140" is removed by chemical mechanical planarization (CMP).

Figure 6I:
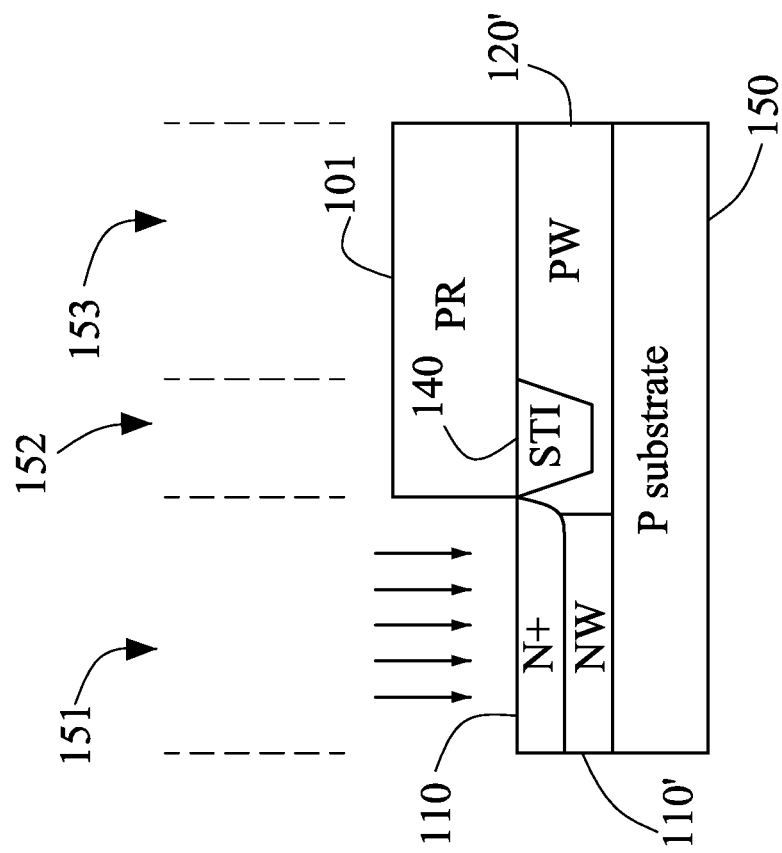

Referring to FIG. 6I, after the isolation structure 140 is formed, a photoresist 101 is formed in the second region 152 and the third region 153, and an N-type structure 110 is formed in the first region 151. Next, referring to FIG. 6I, the photoresist 101 in the third region 153 is removed, a photoresist 101 is formed in the first region 151, and a P-type structure 120 is formed in the third region 153.

In the steps described above, the N-type structure 110 and the P-type structure 120 are formed using ion implantation techniques. Therefore, when the N-type well region 110' and the P-type well region 120' are implanted, they are converted into the N-type structure 110 or the P-type structure 120 due to the difference in implanted ions. The portions covered by the photoresist 101 are not affected by the implantation.

Figure 6K:
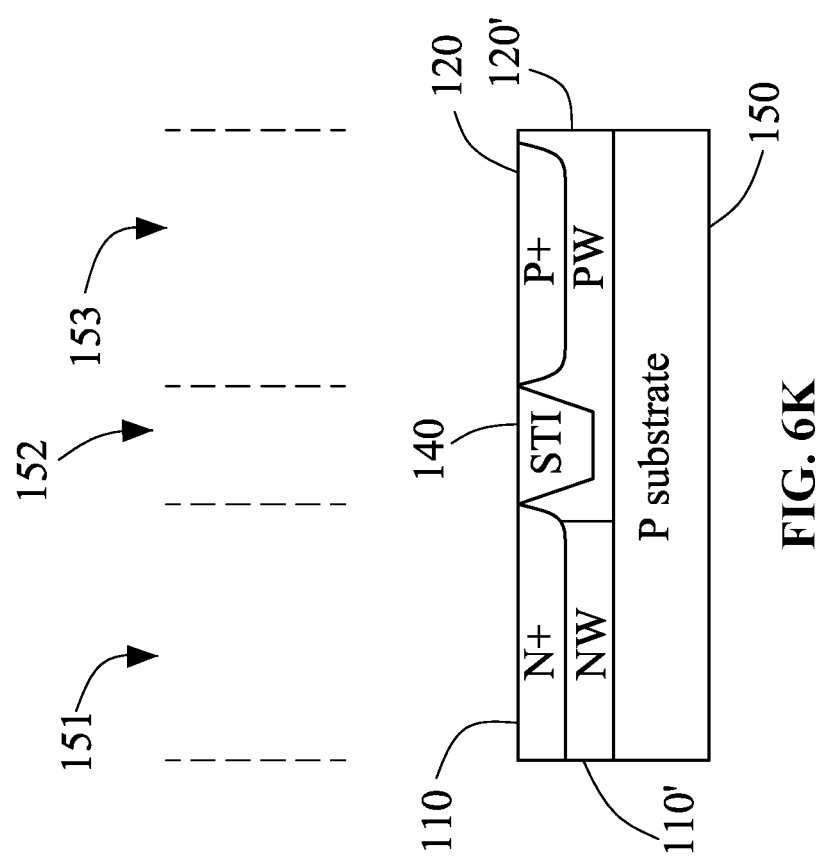

Subsequently, referring to FIG. 6K, the photoresists 101 of the first region 151 and the second region 152 are removed, such that the preparation of the semiconductor device 100 is completed, and the semiconductor device 100 shown in FIG. 3E is produced in accordance with some embodiments of the present disclosure. Moreover, due to the influence of the loading effect, the N-type structure 110 is brought into contact with the P-type well region 120', which causes a leakage current, thereby improving the sensitivity of leakage detection. In some embodiments, as shown in FIG. 5, the wafer test component 100 is formed on the scribe line 22 of the wafer 20, the semiconductor device 100 can be used to obtain a measurement of the leakage current condition of the wafer 20, and after the test is completed, the semiconductor device 100 can be removed without cutting the other microstructure devices 21 when the wafer 20 is cut.

Figure 7B:
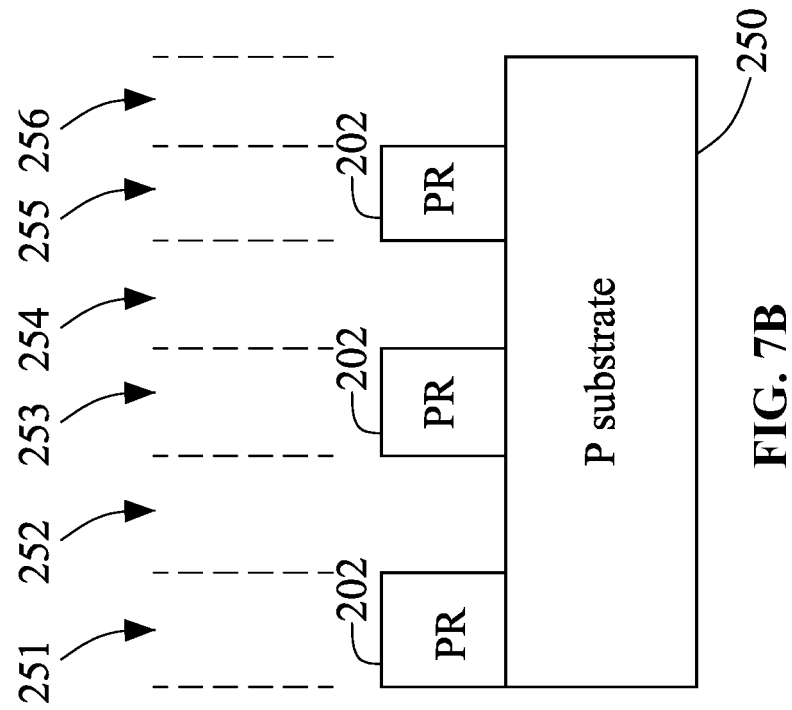
Figure 7A:
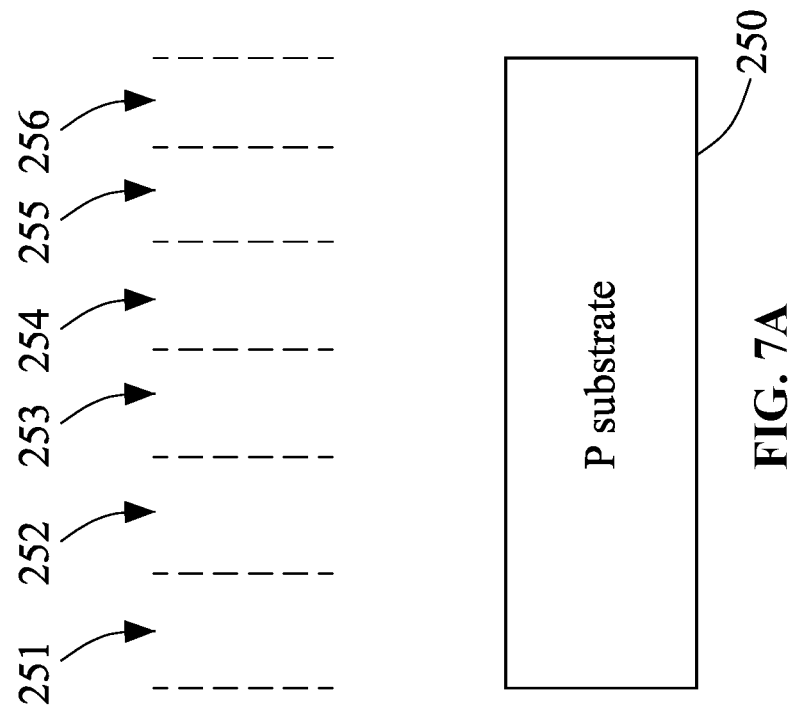
Figure 7C:
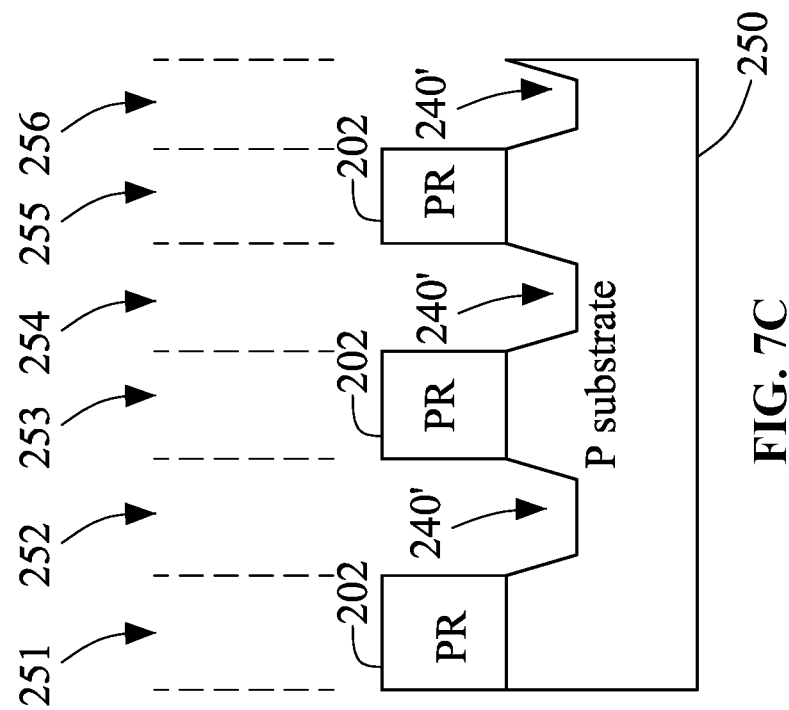

FIG. 7A to FIG. 7K illustrate a method of preparing another semiconductor device 200 in accordance with some embodiments of the present disclosure, First, referring to FIG. 7A, a substrate 250 is provided. The substrate 250 includes a first region 251, a second region 252, a third region 253, a fourth region 254, a fifth region 255, and a sixth region 256, The second region 252 is disposed between the first region 251 and the third region 253, and the fourth region 254 is disposed between the third region 253 and the fifth region 255. In the present embodiment, the substrate 250 is a P-type substrate.

Next, referring to FIG. 7B, a plurality of photoresists 202 are formed in the first region 251, the third region 253, and the fifth region 255. Thereafter, referring to FIG. 7C, a plurality of grooves 240' are formed on the substrate 250. In some embodiments, the grooves 240' are formed by an etch-through technique, and the first region 251, the third region 253, and the fifth region 255 are covered with the photoresist 201, such that the portions of the substrate 250 in the first region 251, the third region 253 and the fifth region 255 are unaffected by the etch-through technique.

Figure 7D:
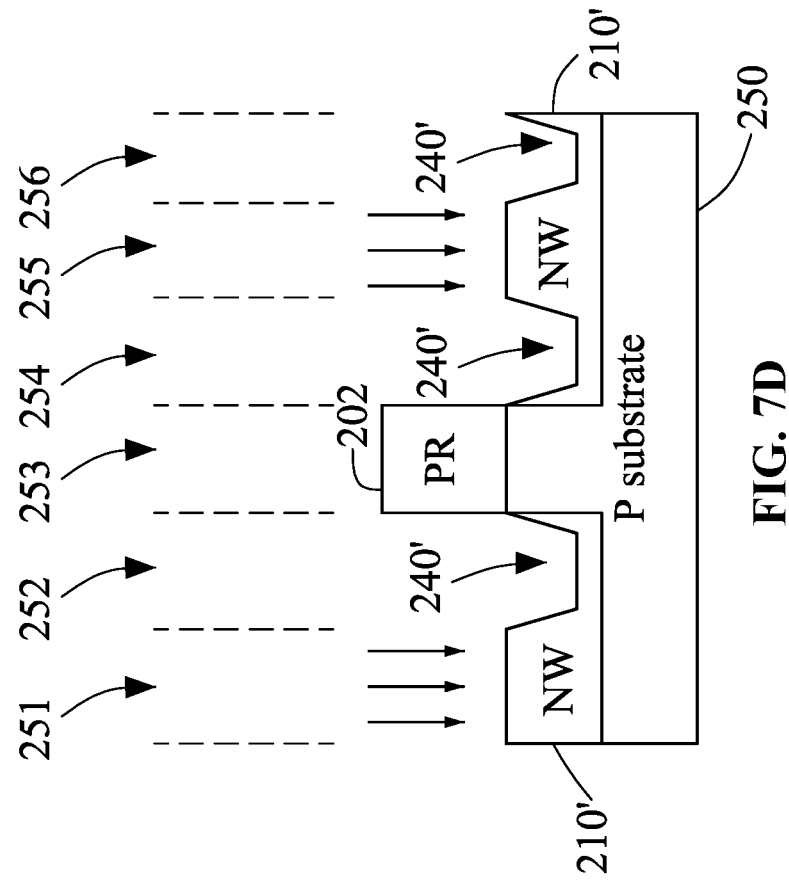
Figure 7J:
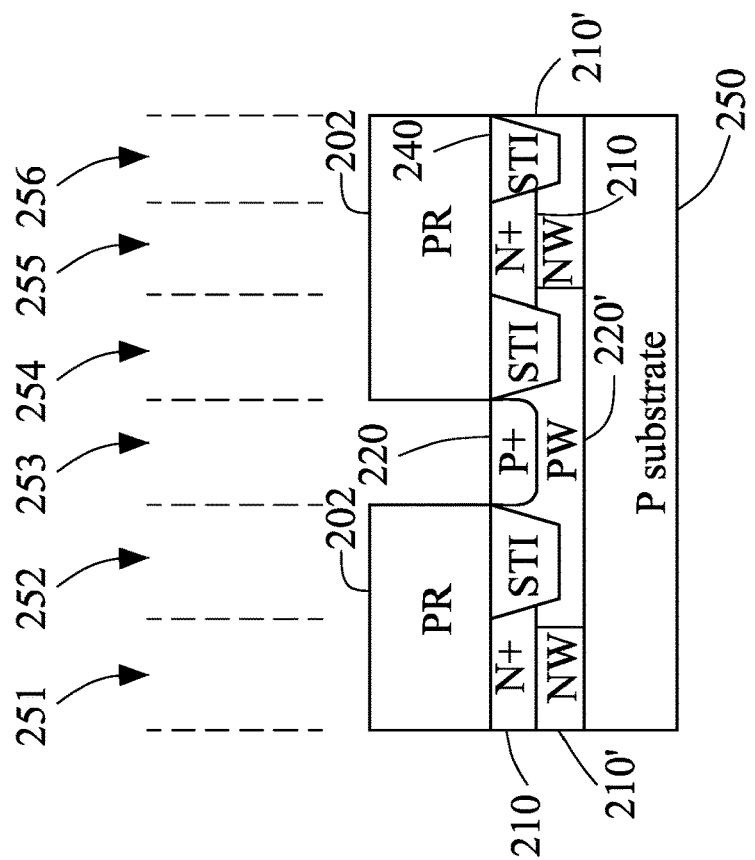

After the grooves 240' are formed, referring to FIG. 7D, the photoresists 202 of the first region 251 and the filth region 255 are removed, and a plurality of N-type well regions 210' are formed on the substrate 250 in the first region 251, the second region 252, the fourth region 254, the fifth region 255 and the sixth region 256.

Next, referring to FIG. 7E, the photoresist 202 of the third region 253 is removed, a plurality of photoresists 202 are formed in the first region 251, the fifth region 255, and the sixth region 256, and a P-type well region 220' is formed in the second region 252, the third region 253 and the fourth region 254 of the substrate 250, When the P-type well region 220' is formed, the area of the N-type well region 210' is reduced due to the loading effect, such that portions of the first region 251 and the fifth region 255 are included in the P-type well region 220'. Next, referring to FIG. 7F, the photoresists 202 of the first region 251, the fifth region 255, and the sixth region 256 of the substrate 250 are removed.

In the steps of forming the plurality of N-type well regions 210' and the P-type well region 220' in the present embodiment, the N-type well regions 210' and the P-type well region 220' are formed using ion implantation techniques. When the substrate 250 is subjected to ion implantation, the substrate 250 is converted into the N-type well region 210' or the P-type well region 220° due to the difference in implanted ions. The portions covered by the photoresist 201 are not affected by the implantation.

Next, referring to FIG. 7G, an isolation structure layer 240" is formed on the surface of the substrate 250, wherein the isolation structure layer 240" covers the surface of the substrate 250 and fills the plurality of grooves 240'. Thereafter, referring to FIG. 7H, the isolation structure layer 240" is removed from the surface of the substrate 250, and a plurality of isolation structures 240 are formed in the grooves 240' of the second region 252, the fourth region 254, and the sixth region 256. In some embodiments, the isolation structure layer 240" can be removed by chemical mechanical planarization.

Figure 7I:
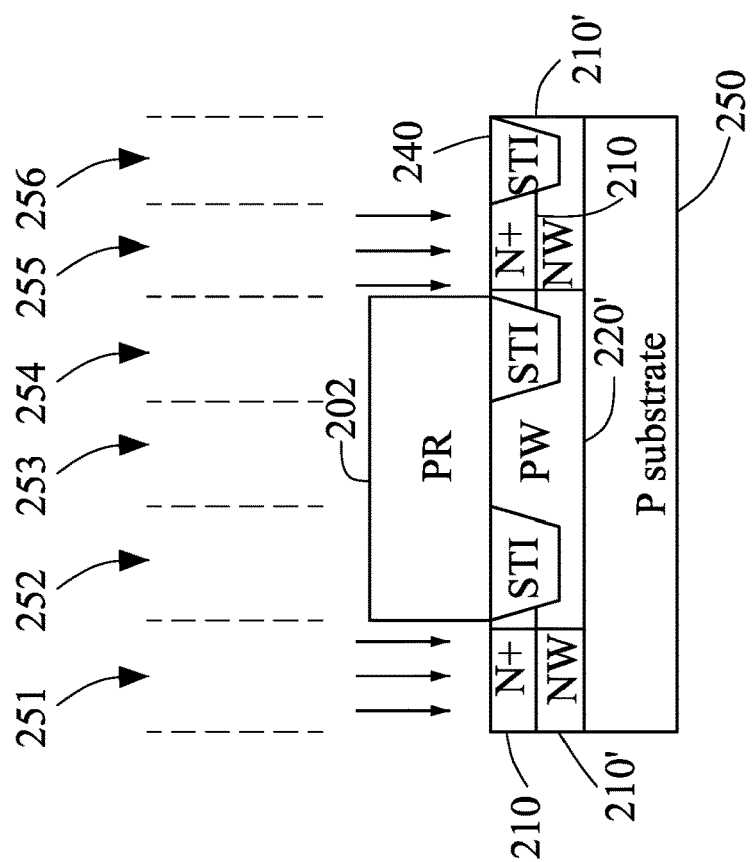

After the isolation structures 240 are formed, referring to FIG. 7I, a photoresist 202 is formed in the second region 252, the third region 253, and the fourth region 254, and a plurality of N-type structures 210 are formed on the N-type well regions 210' of the first region 251 and the fifth region 255. Next, referring to FIG. 7J, the photoresist 202 in the third region 253 is removed, photoresists 202 are formed on the substrate 250 in the first region 251, the fifth region 255, and the sixth region 256, and a P-type structure 220 is formed on the P-type well region 220' in the third region 253.

In the steps of forming the plurality of N-type structures 210 and the P-type structure 220, the N-type structures 210 and the P-type structure are formed using ion implantation techniques. When the N-type well regions 210' and the P-type well region 220' are implanted, they are converted into the N-type structures 210 and the P-type structure 220 due to the difference in implanted ions. The portions covered by the photoresist 201 are not affected by the implantation.

Figure 7K:
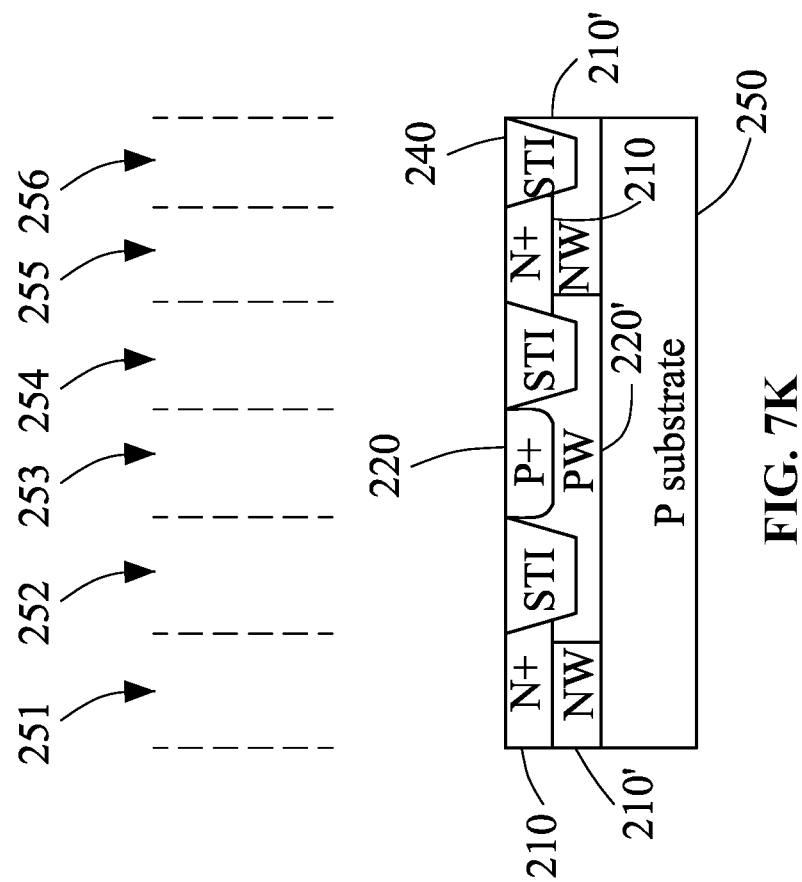

Subsequently, the photoresists 202 of the first region 251, the second region 252, the fourth region 254, the fifth region 255 and the sixth region 256 of the substrate 250 are removed, such that the preparing of the semiconductor device 200 is completed, and the semiconductor device 200 shown in FIG. 4A is produced in accordance with some embodiments of the present disclosure. As shown in FIG. 7K, the semiconductor device 200 of the present embodiment has a reduced area of the N-type well region 210' due to the loading effect, such that the P-type well region 220' is in contact with the N-type structure 210, thereby generating a leakage current phenomenon. In some embodiments, the wafer test component 200 can be disposed on the scribe line 22 of the wafer 20 to measure the leakage of the wafer 20, and the semiconductor device 200 can be directly cut off after the measurement, as in the previous embodiment. The area of use of the wafer 20 is not wasted.

The semiconductor device 100 of the present disclosure is configured so that the shape of the P-type structure and the N-type structure includes more corners and turns than the conventional design. In addition, the corners and turns in the target device of the ion implantation cannot be completely implanted due to the loading effect, which thereby generates leakage current characteristics, and the semiconductor device 100 is therefore able to be used for testing the leakage current condition of the entire wafer 20. Furthermore, the presence of more corners or more turns improves the ability of the device to detect a leakage current. The semiconductor device 100 is further disposed on the scribe line 22 of the wafer 20. The wafer dicing is performed directly after the leakage current test, such that the semiconductor device 100 is directly cut off so as not to affect other microstructure devices 21 on the wafer 20, saving material use and production costs.

One aspect of the present disclosure provides a semiconductor device including a substrate, a first type region, a second type region and an isolation structure. The first type region is disposed on the substrate and has a ring structure. The second type region is disposed on the substrate and disposed in the center of the first type region. The isolation structure is disposed between the first type region and the second type region, wherein the second type region has a square shape and includes a plurality of corners.

Another aspect of the present disclosure provides a semiconductor device comprising: a substrate, a first type region, a second type region and an isolation structure. The first type region is disposed on the substrate and has a line structure, and the first type region further includes a plurality of turns and a plurality of U-shaped structures. The second type region is disposed on the substrate and comprises a plurality of vertical structures and a plurality of horizontal structures, wherein the horizontal structures extend into the U-shaped structure. The isolation structure is disposed between the first type region and the second type region, wherein the second type region has a square shape and includes a plurality of corners.

Another aspect of the present disclosure provides a method for preparing semiconductor devices, comprising: providing a substrate, wherein the substrate comprises a first region, a second region and a third region, wherein the second region is disposed between the first region and the third region; forming a plurality of photoresists in the first region and the third region; forming a groove in the third region; removing the photoresist of the first region, and forming a second well region in the first region; forming a photoresist in the first region, removing the photoresist of the third region, and forming a first well region in the second region and the third region; removing the photoresist of the first region; forming an isolation structure in the groove; forming a photoresist in the second region and the third region, and forming a second type region in the first region; removing the photoresist of the third region, forming a photoresist in the first region, and forming a first type region in the third region; and removing the photoresists of the first region and the second region; wherein the first well region, the second well region, the first type region and the second type region are formed by ion implantation.

Another aspect of the present disclosure provides a method for preparing semiconductor devices, comprising: providing a substrate, wherein the substrate includes a first region, a second region, a third region, a fourth region, a fifth region and a sixth region, wherein the second region is disposed between the first region and the third region, the fourth region is disposed between the third region and the fifth region, and the fifth region is disposed between the fourth region and the sixth region; forming a plurality of photoresists in the first region, the third region and the fifth region; forming a plurality of grooves in the second region, the fourth region and the sixth region; removing the photoresist of the first region and the fifth region and forming a plurality of second well regions in the first region, the second region, the fourth region, the fifth region and the sixth region; removing the photoresist of the third region, forming a photoresist in the first region, the fifth region and the sixth region, and forming a first well region in the second region, the third region and the fourth region; removing the photoresists of the first region, the fifth region and the sixth region; forming a plurality of isolation structures in the grooves of the second region, the fourth region, and the sixth region; forming a plurality of photoresists in the second region, the third region, and the fourth region, and forming a plurality of second type regions in the first region and the fifth region; removing the photoresist of the third region, forming a plurality of photoresists in the first region and the fifth region, and forming a plurality of first type regions in the third region; and removing the photoresists of the first region, the second region, the fourth region and the fifth region; wherein the first well region, the second well region, the first type region and the second type region are formed by ion implantation.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing semiconductor devices, comprising:
    providing a substrate, wherein the substrate includes a first region, a second region, a third region, a fourth region, a fifth region and a sixth region, wherein the second region is disposed between the first region and the third region, the fourth region is disposed between the third region and the fifth region, and the fifth region is disposed between the fourth region and the sixth region;
    forming a plurality of photoresists in the first region, the third region and the fifth region;
    forming a plurality of grooves in the second region, the fourth region and the sixth region;
    removing the photoresists of the first region and the fifth region and forming a plurality of second well regions in the first region, the second region, the fourth region, the fifth region and the sixth region;
    removing the photoresist of the third region, forming the photoresist in the first region, the fifth region and the sixth region, and forming a first well region in the second region, the third region and the fourth region;
    removing the photoresists of the first region, the fifth region, and the sixth region;
    forming a plurality of isolation structures in the grooves of the second region, the fourth region, and the sixth region;
    forming a plurality of photoresists in the second region, the third region, and the fourth region, and forming a plurality of second type regions in the first region and the fifth region;
    removing the photoresist of the third region, forming a plurality of photoresists in the first region and the fifth region, and forming a plurality of first type regions in the third region; and
    removing the photoresists of the first region, the second, the fourth region and the fifth region;
    wherein the first well region, the second well region, the first type region and the second type region are formed by ion implantation.

2. The method of claim 1, further comprising:
    forming an isolation structure layer on a surface of the substrate, wherein the isolation structure layer covers the surface of the substrate; and
    removing the isolation structure layer from the surface of the substrate.

3. The method of claim 1, wherein the substrate is a P-type substrate.

4. The method of claim 1, wherein the first type region is a P-type structure, the second type region is an N-type structure, the first well region is a P-type well, and the second well region is an N-type well.

* * * * *